(12) United States Patent
Yu

(10) Patent No.: US 8,836,104 B2
(45) Date of Patent: Sep. 16, 2014

(54) APPARATUS FOR CHIP THERMAL STRESS RELIEF

(75) Inventor: Ho-Yuan Yu, Saratoga, CA (US)

(73) Assignee: Ho-Yuan Yu, Saratoga, CA (US)

( * ) Notice: Subject to any disclaimer, the term of this patent is extended or adjusted under 35 U.S.C. 154(b) by 54 days.

(21) Appl. No.: 13/411,541

(22) Filed: Mar. 3, 2012

(65) Prior Publication Data

US 2013/0228912 A1    Sep. 5, 2013

(51) Int. Cl.
*H01L 23/34*  (2006.01)
*H01L 23/488*  (2006.01)

(52) U.S. Cl.
USPC ........... 257/692; 257/675; 257/676; 257/669; 257/712; 257/713; 257/E23.037; 257/E23.08; 257/E23.101

(58) Field of Classification Search
USPC ................. 257/669, 675, 676, 692, 712, 713, 257/E23.037, E23.08, E23.101
See application file for complete search history.

(56) References Cited

U.S. PATENT DOCUMENTS

| | | | |
|---|---|---|---|
| 4,884,124 A * | 11/1989 | Mori et al. | 257/783 |
| 5,126,820 A * | 6/1992 | Brown | 257/420 |
| 5,397,915 A * | 3/1995 | Nose | 257/676 |
| 5,510,650 A | 4/1996 | Erskine | |
| 5,701,034 A * | 12/1997 | Marrs | 257/706 |
| 6,197,615 B1 * | 3/2001 | Song et al. | 438/111 |
| 6,215,185 B1 | 4/2001 | Kikuchi et al. | |
| 6,341,070 B1 | 1/2002 | Yu | |
| 6,396,700 B1 | 5/2002 | Chu et al. | |
| 6,940,721 B2 | 9/2005 | Hill | |
| 2001/0009301 A1 * | 7/2001 | Azuma | 257/698 |
| 2005/0046008 A1 * | 3/2005 | Gai | 257/690 |
| 2008/0246166 A1 * | 10/2008 | Kaneda et al. | 257/784 |

* cited by examiner

*Primary Examiner* — Peniel M Gumedzoe
(74) *Attorney, Agent, or Firm* — Cheng Intellectual Property Group

(57) ABSTRACT

Various stress relief structures are provided for effectively reducing thermal stress on a semiconductor chip in a chip package. Trenches on a metal substrate are created in groups in two-dimension, where each trench is opened from top or bottom surface of the metal substrate and in various shapes. The metal substrate is partitioned into many smaller substrates depending on the number of trench groups and partitions, and is attached to a semiconductor chip for stress relief. In an alternative embodiment, a plurality of cylindrical metal structures are used together with a metal substrate in a chip package for the purpose of heat removal and thermal stress relief on a semiconductor chip. In another alternative embodiment, a metal foam is used together with a semiconductor chip to create a chip package. In another alternative embodiment, a semiconductor chip is sandwiched between a heat sink and a circuit board by solder bumps directly with underfill on the circuit board.

4 Claims, 5 Drawing Sheets

APPARATUS FOR CHIP THERMAL STRESS RELIEF

BACKGROUND

1. Field of Invention

This disclosure generally relates to techniques for reducing thermal stress on chips. More specifically, this disclosure relates to techniques for reducing thermal stress on large Integrated Circuit (IC) chips and large discrete chips by using stress relief structures while incorporating heat removal capability.

2. Description of the Related Art

In order to realize the full potential of silicon power devices, it is essential that contacts to the devices possess the lowest possible electrical and thermal resistances. The requirement presents a serious problem since all low-resistivity materials exhibit high thermal expansion relative to silicon. If any of these materials are bonded to silicon at an elevated temperature and subsequently cooled, the silicon will be left under compressional stress. For the high-conductivity metals, copper and aluminum, the stresses may be substantial. As the complexity and switching speed of semiconductor chips continue to increase, the thermal expansion problem become even more important. Therefore, what is needed is a mechanism to effectively remove the heat and relieve the thermal stress of a large Integrated Circuit (IC) chip or discrete chip to improve reliability.

SUMMARY

A stress relief metal pad is attached to the backside of a large Integrated Circuit (IC) chip or both sides of a discrete chip to remove heat and thermal stress, and further improve reliability. In addition, the stress relief metal pad can provide current path for the IC chip or discrete chip.

One embodiment of the present disclosure provides a chip package. This chip package includes a metal substrate and a semiconductor chip attached to the top surface of the metal substrate via at least one adhesive layer. The metal substrate includes at least one trench opened from its top surface and at least one trench opened from its bottom surface in a first horizontal direction and these trenches are opened partially across a thickness of the metal substrate. In addition, at least a portion of the top surface of the metal substrate is not in contact with the semiconductor chip. The adhesive layer includes a plated layer and a solder layer.

Each trench may be substantially perpendicular to the surface in which it is opened. The depth of each trench is approximately between 50% and 95% of the thickness of the metal substrate and the width of each trench is approximately between 1% and 10% of the thickness of the metal substrate. A variation of this embodiment may have a trench that has a slope with an unequal top width and bottom width, and the top width is about twice the bottom width.

The chip package can further include a plurality of trench groups along the first horizontal direction. Each trench group has at least one trench opened from the top surface and from the bottom surface of the metal substrate. The distance between any two of the trench groups is at least three times a trench group width.

In a variation of this embodiment, the chip package may further include a plurality of trench groups along a second horizontal direction, and the first and second horizontal directions are substantially perpendicular to each other.

Another embodiment for relieving thermal stress includes a metal substrate having a plurality of trench groups along a first horizontal direction and a plurality of trench groups along a second horizontal direction and the first and second horizontal directions are substantially perpendicular to each other. Each trench group has at least one trench opened from the top surface and at least one trench opened from the bottom surface of the metal substrate and the trenches are partially across a thickness of the metal substrate. The distance between any two trench groups is at least three times a trench group width. Each trench has a predetermined depth and width based on the thickness of the metal substrate. As a result, the metal substrate is partitioned by the trench groups into a number of smaller metal substrates in which the number is an integer larger than one.

Furthermore, at least one trench of a given trench group may be extended only partially across a width of the metal substrate in either the first horizontal direction or the second horizontal direction.

Another embodiment for relieving thermal stress includes a metal substrate and a plurality of elongate cylindrical structures arranged in a two-dimensional (2D) array and attached to one surface of the metal substrate. The elongate cylindrical structures are substantially perpendicular to the attached surface of the metal substrate and are made of conductive material. The diameter of each elongate cylindrical structure is about 1% to 15% of its length. Furthermore, a semiconductor chip can be attached to the opposite end of the elongate cylindrical structures by layers of metal and soldering.

Another embodiment of a chip package includes a semiconductor chip attached to one surface of a conductive substrate through a soldering layer. The conductive substrate is made from a metal foam having a relative density approximately in the range of 7% to 25% of a bulk material which is a good conductive material.

Another embodiment of a chip package includes a semiconductor chip with a first group of solder bumps disposed evenly apart and immediately on its upper surface and a second group of solder bumps disposed evenly apart and immediately on its lower surface. A heat sink is disposed above the first group of solder bumps and a circuit board is disposed below the second group of solder bumps. A layer of underfill is disposed on the surface of the circuit board and between the second group of solder bumps. In a variation of this embodiment, the solder bumps may be elongated cylindrical conductive metal.

DETAILED DESCRIPTION

The following description is presented to enable any person skilled in the art to make and use the disclosure, and is provided in the context of a particular application and its requirements. Various modifications to the disclosed embodiments will be readily apparent to those skilled in the art, and the general principle defined herein may be applied to other embodiments and applications without departing from the spirit and scope of the present disclosure. Thus, the present disclosure is not intended to be limited to the embodiments shown, but is to be accorded the widest scope consistent with the principle and features disclosed herein.

Due to mismatch of the thermal expansion coefficients of silicon chip (approximately 4.0E-6/° C.) and the package (e.g. Copper, approximately 16.5E-6/° C.), the stress generated from thermal expansion on silicon chips due to temperature changes (e.g. repetitive heating and cooling) usually causes chips to crack or even destroys the devices. The stress relief pad made of Mo and W may reduce the stress to certain degree. However, it is not able to handle the stress for large chips, for example, chip size larger than 10 mm². Thermal expansion may happen in all directions of the package, namely, x direction (horizontal left/right), y direction (horizontal front/back) and z direction (vertical top/down). Usually, stresses from thermal expansion in horizontal directions (x direction or y direction) are more of a concern than vertical direction (z direction) and the embodiments of this disclosure provide good solutions to these stresses and prolong life of chips.

Figure 1A:
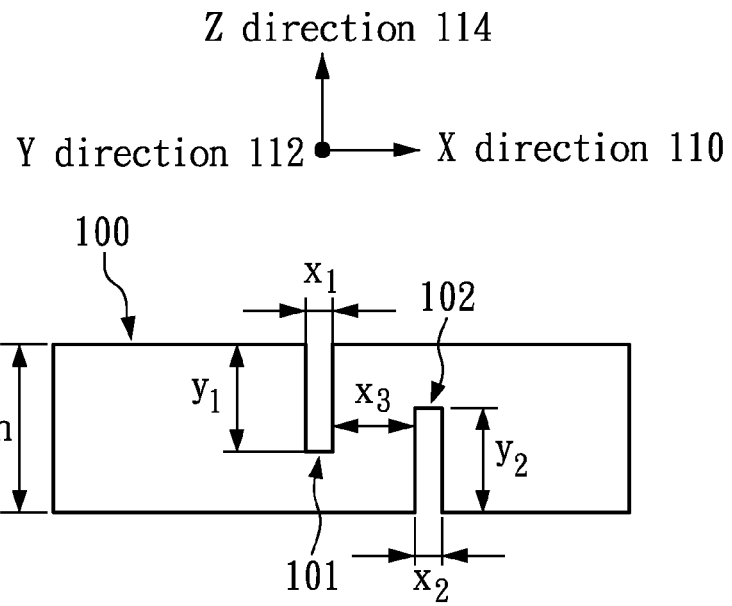
FIG. 1A is a block diagram illustrating a sectional view of a stress relief structure with two trenches in accordance with one or more embodiments.

FIG. 1A presents a block diagram illustrating a sectional view of a stress relief structure 100. Structure 100 is a metal pad (or substrate) of copper or other conductive metal in rectangular shape where a plane of this pad is defined by a x direction 110, y direction 112 (which is into the plane of FIG. 1A) and z direction 114. X direction 110, y direction 112 and z direction 114 are substantially perpendicular to each other. Two trenches 101 and 102 are cut into the metal pad in z direction 114 as shown in FIG. 1A. Although the trenches 101 and 102 are preferred in z direction 114, trenches made from different angles with respect to top and bottom surfaces may be possible. The first trench 101 is defined by a width x1 and depth y1 and the second trench 102 is defined by a width x2 and y2. The first trench 101 is cut from the top surface while the second trench 102 is cut from the bottom surface. These trenches may be made by sawing or stamping. Depths, y1 and y2, and widths, x1 and x2 of these two trenches can be designed so that it can maintain the flexibility of the pad to provide stress relief. The depths, y1 and y2, of these trenches can range from 50% to over 95% of the height h (or thickness) of the metal pad 100. The widths, x1 and x2, of these trenches can range from less than 1% to above 10% of the height h of the metal pad 100 depending on application requirements. The distance between trenches 101 and 102 is defined as x3 which is important to the flexibility of stress relief function and ranges from less than 1% to above 25% of the height h of the metal pad 100. In addition, the widths x1 and x2 may or may not be equal. Similarly, depths y1 and y2 may and may not be equal. The shape of the pad is not limited to rectangular and can be square, hexagon, octagon or other shapes.

Figure 1B:
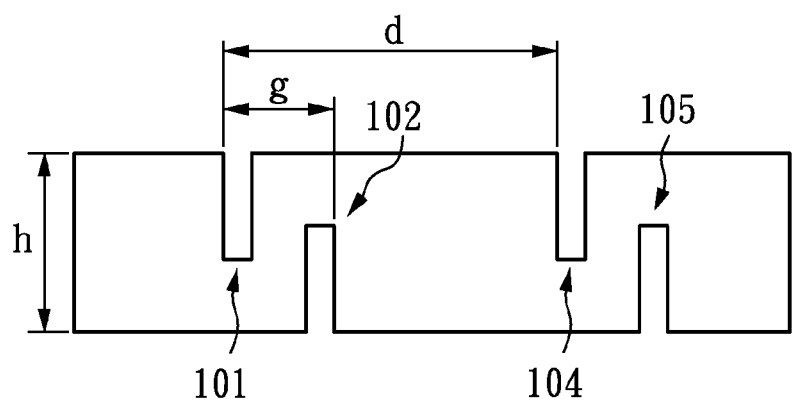
FIG. 1B is a block diagram illustrating a sectional view of a stress relief structure of more than one group of trenches in accordance with one or more embodiments.

Although FIG. 1A illustrates only two trenches, it is possible to repeat these trenches in group along horizontal directions (x direction 110 and y direction 112) as shown in FIG. 1B. One or more trenches that are grouped together as a basis for replication is referred to herein as the "trench group". In FIG. 1B, trenches 101 and 102 form a first trench group and trenches 104 and 105 form a second trench group in x direction 110. A group of trenches has width referred to herein as the "trench group width" g is measured between two farthest trenches in the group. For example, the group width of a trench group containing trenches 101 and 102 is x1+x2+x3. The distance between any two trench groups d is preferred to be at least three times of the group width g. In various embodiments, the second pair of trenches may be made in y direction 112.

Figure 1C:
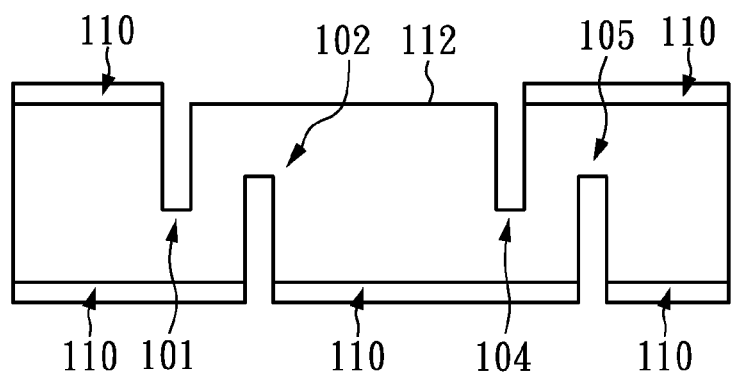
FIG. 1C is a block diagram illustrating a sectional view of a stress relief structure of more than one group of trenches in accordance with one or more embodiments.

FIG. 1C illustrates the same metal pad 100 with an extra plating 110 of Ni, NiAu or NiAg on both top and bottom surfaces of the metal pad 100 for manufacturability in soldering process. Not all of the top surfaces are coated with solderable plating and attached to semiconductor chip. For example, section 112 is not coated with solderable plating and is made lower than other sections of top surface to avoid contacting semiconductor chip during soldering process. When there is more than one group of trenches, one or more sections of the top surfaces may avoid contacting semiconductor chip depending on the need for the expansion flexibility of metal pad 100. For example, the sections which do not have contact with semiconductor chip may be alternating among trench groups (i.e. one trench group has contact with semiconductor chip and next neighboring trench group does not have contact with semiconductor chip) or a variation of this pattern. Of course, it is also possible to have the whole top surface in contact with the semiconductor chip.

Figure 2A:
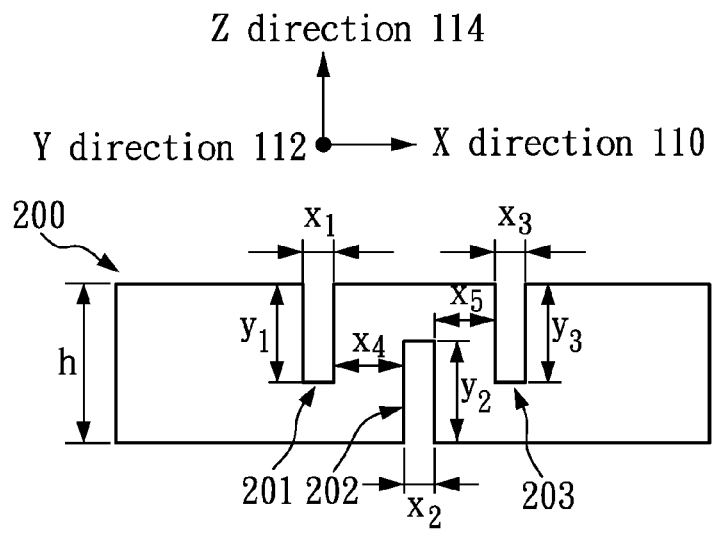
FIG. 2A is a block diagram illustrating a sectional view of a stress relief structure with three trenches in accordance with one or more embodiments.

FIG. 2A presents a block diagram illustrating a sectional view of a stress relief structure 200 with three trenches 201, 202 and 203 in z direction 114. Structure 200 is a metal pad of copper or other conductive metal and has two trenches 201, 203 cut from top surface while one trench 202 cut from bottom surface. Alternatively, there can be one trench from the top surface and two trenches from the bottom surface. The requirement of depth and width of the triple trenches in structure 200 is similar to that of structure 100 of FIG. 1A. The structure 200 has an advantage of providing more even thermal expansion while this metal pad keeps its level flat during expansion caused by heat. The width of trenches x1, x2 and x3 can be the same as that of trenches x1 and x2 in structure 100 (i.e. two-trench structure). The distances x4 and x5 which are between any two trenches can be the same as distance x3 in two-trench structure 100. Although FIG. 2A illustrates only three trenches, it is possible to repeat these trenches in groups along either x direction 110 or y direction 112. Again, the shape of the pad is not limited to rectangular and can be square, hexagon, octagon or other shapes.

Figure 2B:
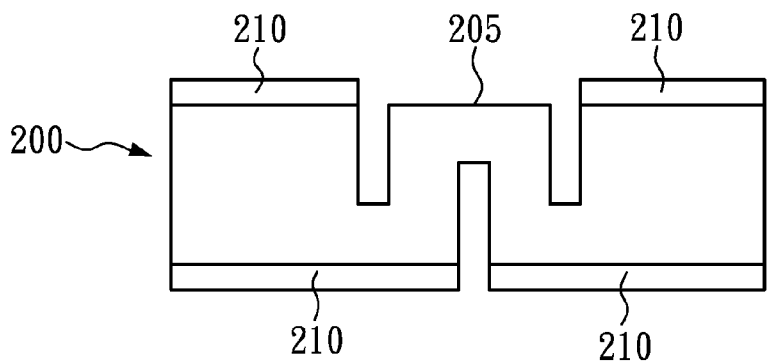
FIG. 2B is a block diagram illustrating a sectional view of a stress relief structure with three trenches in accordance with one or more embodiments.

FIG. 2B illustrates the same metal pad 200 with an extra plating 210 of Ni, NiAu or NiAg on both top and bottom surfaces of the metal pad 200 for manufacturability in soldering process. The middle section 205 is not coated with solderable plating and it is more desirable with non-solderable surface like oxide or other material. The section 205 is made lower than the other sections of top surface to avoid contacting semiconductor chip during soldering process.

Figure 2C:
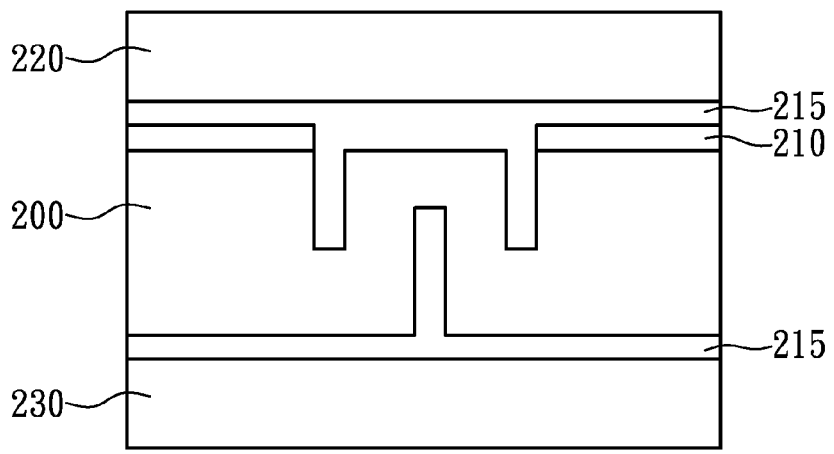
FIG. 2C is a block diagram illustrating a sectional view of a stress relief module in accordance with one or more embodiments.

FIG. 2C illustrates a complete stress relief module with the stress relief metal pad 200 sandwiched between a semiconductor chip 220 and a packaging related structure 230 which can be a metal structure of a package or other cooling apparatus such as heat pipes or a structure with fins. The stress relief metal pad 200 can provide even heat conduction and is generally kept within 5 mm$^2$. A plated layer 210 and solder layer 215 are placed between metal pad 200 and semiconductor chip 220 as shown in the figure. As mentioned earlier, section 205 of the top surface of metal pad 200 does not have solder plating and therefore is not in touch with the semiconductor chip 220. The semiconductor chip 220 may be an integrated circuit or a discrete device. The solder layer 215 can be solder, conductive epoxy or non-conductive epoxy. Another solder layer 215 is placed between metal pad 200 and packaging related structure 230 as shown in the figure.

Figure 3:
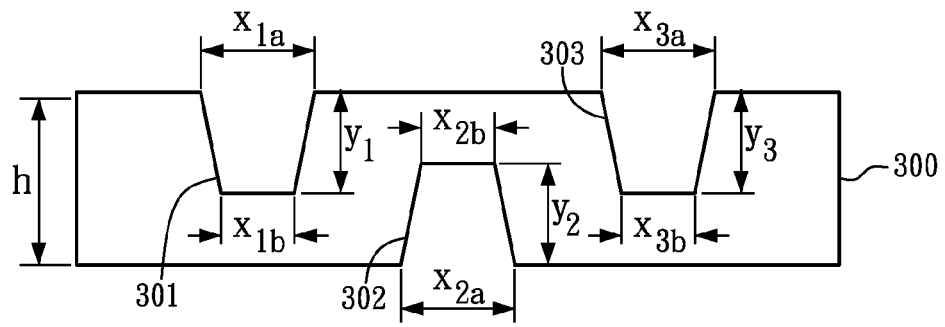
FIG. 3 is a block diagram illustrating a sectional view of a stress relief structure with three trenches in accordance with one or more embodiments.

FIG. 3 illustrates a metal pad with sloped trenches in z direction. Compared to FIG. 2A, metal pad 300 has better stress relief capability than that of metal pad 200 and is easier to made by stamping or sawing. The thermal expansion stress relief capability is dominated by the widths x1, x2 and x3 (further divided into $x1_a$, $x1_b$, $x2_a$, $x2_b$, $x3_a$ and $x3_b$ later) of trenches 301, 302 and 303 respectively. The width of each trench further includes top width and bottom width. The "top width" is referred to the width of a trench at the edge of the surface being cut or opened and the "bottom width" is referred to the width of a trench inside the metal pad (i.e. opposite end to where the top width is measured). For example, trench 301 has top width $x1_a$ and bottom width $x1_b$. Similarly, trench 302 has top width $x2_a$ and bottom width $x2_b$, and trench 303 has top width $x3_a$ and bottom width $x3_b$. The top width of each trench is roughly twice the bottom width. The widths x1, x2 and x3 are in the range of 0.1% to 10% of the height h of metal pad 300. The depths, y1, y2 and y2 of trenches 301, 302 and 303 respectively can range from 50% to over 95% of the height h of the metal pad 300. In an alternative embodiment, the trenches 301, 302 and 303 may be made in different shapes, such as round, hexagon or other shapes.

Figure 4:
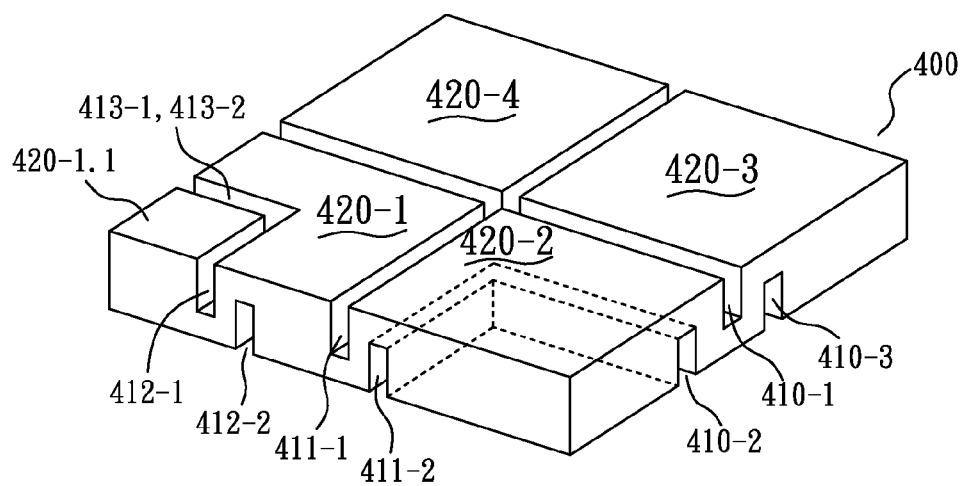
FIG. 4 is a block diagram illustrating a three dimensional view of a stress relief structure in accordance with one or more embodiments.

FIG. 4 illustrates an embodiment of a three dimensional view of a stress relief pad. A stress relief pad 400 is partitioned by a first and a second stress relief trench groups 410 and 411 into several smaller pads 420 (or mini pads). These stress relief trenches 410 and 411 can be various types in terms of numbers and shapes as illustrated in FIGS. 1, 2 and 3. For example, stress relief trenches 410 may be a group of three vertical trenches in z direction and have the top trench 410-1 fully extended across relief pad 400 and bottom trenches 410-2 and 410-3 partially extended across the relief pad 400 in y direction. Similarly, a trench group 411 of two trenches has top trench 411-1 full extended across relief pad 400 and bottom trench 411-2 partially extended across relief pad 400 in x direction. Therefore, four mini pads 420-1, 420-2, 420-3 and 420-4 are created as shown in FIG. 4. The bottom trenches 410-2 and 411-2 are connected inside mini pad 420-2 as shown in dash lines. In addition to a single trench group in each horizontal direction, multiple trench groups may be used. For example, a third trench group 412 with two vertical trenches (412-1 and 412-2) in z direction is formed and partially extended into the mini pad 420-1 in x direction. Similarly, a fourth trench group 413 with two vertical trenches (top trench 413-1 and bottom trench 413-2 not shown) is formed and partially extended into the mini pad 420-1. The bottom trenches 412-2 and 413-2 may be connected (not shown) inside mini pad 420-1. These two trench groups 412 and 413 form a sub-mini pad 420-1.1. When various groups of stress relief trenches are made in either x direction or y direction or both directions, the stress relief pad 400 can contain different number of mini pads such as 2, 3, 4, 5, 6, and so on depending on the shape and size of semiconductor chip. The odd number of mini pads can be created when groups of trenches are only in one direction (for example two trench groups crossing x direction only), or one or more groups of trenches cross only half way or partially through either x direction or y direction of the stress relief pad 400. The stress relief pad 400 allows thermal expansion in all directions along with the semiconductor chip without adding much stress to the chip.

Figure 5A:
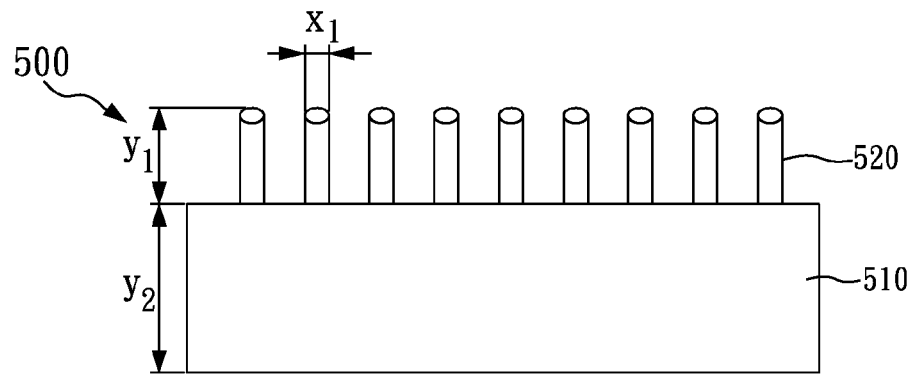
FIG. 5A is a block diagram illustrating a sectional view of an alternative stress relief structure in accordance with one or more embodiments.

FIG. 5A illustrates a sectional view of an alternative stress relief structure 500. The structure 500 includes a group of vertical thin cylindrical metal structures 520 arranged in x direction on top of a base pad 510. Both the base pad 510 and cylindrical metal structures 520 are preferred to be the same material such as copper, but can also be different materials. When both the base pad 510 and cylindrical metal structure 520 are the same material, the structure 520 can be created out of a big metal pad which originally includes both base pad 510 and structure 520. The benefit of cylindrical metal structures 520 is its flexibility to relieve the stress caused by thermal expansion mismatch between a large semiconductor chip and base pad 510, and at the same time provide current conduction. The diameter x1 of each cylindrical metal structure 520 is about 1% to 15% of its own length y1 for the flexibility and the determination of length y1 depends on the chip size this relief structure is attached to. The space between each cylindrical metal structure 520 ranges roughly from its diameter x1 to twice its diameter. The height of the base pad 510 is y2. Although FIG. 5 shows the relief structure 500 in one dimension (x direction), the cylindrical metal structures 520 are actually repeated in both x direction and y direction as a two dimensional array. The relief structure 500 can be made by stamping, sawing, plating or other methods with copper or other good thermal conductive metal.

Figure 5B:
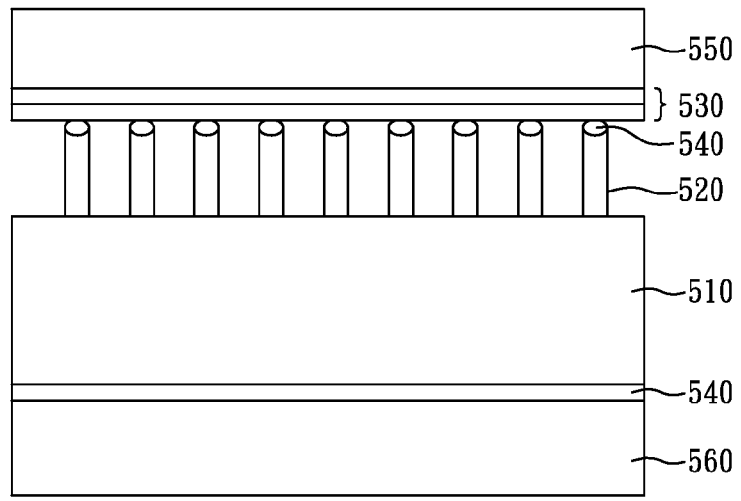
FIG. 5B is a block diagram illustrating a sectional view of a stress relief module of FIG. 5A in accordance with one or more embodiments.

FIG. 5B illustrate a sectional view of a stress relief module using stress relief structure 500. The stress relief structure 500 is attached to a semiconductor chip 550 by soldering, blazing or wire connecting through holes of semiconductor chip for press fit. As illustrated in FIG. 5B, at the bottom surface of semiconductor chip 550, there are layers of back metal 530 of Ti, Ni and Ag. The stress relief structure 500 is attached to the back metal 530 through the cylindrical metal structures 520 by soldering 540. As a result, the cylindrical metal structures 520 also serve as the heat conduction path from semiconductor chip 550 to the base pad 510 without directly connecting the base pad 510 to the semiconductor chip 550. Furthermore, a heat sink 560 is further attached to the back side of base pad 510 by soldering. The wiring from semiconductor chip 550 through stress relief structure to circuit board is not shown for simplified view.

Figure 6:
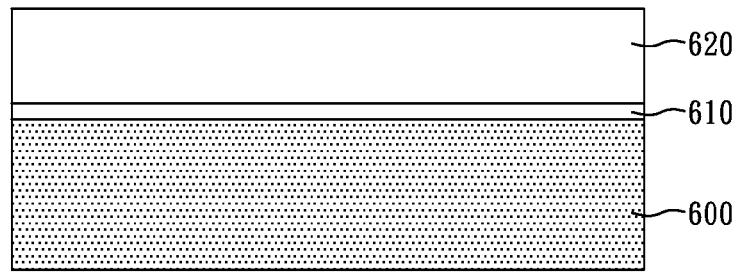
FIG. 6 is a block diagram illustrating a sectional view of another alternative stress relief module in accordance with one or more embodiments.

FIG. 6 illustrates a sectional view of another alternative stress relief structure using metal foams. The metal foam stress relief structure 600 can be made from copper metal foam or nickel metal foam or other metal foams. Metal foam is very effective in reducing the stress applied to a chip. However, the conductivity may be reduced. Therefore, proper foam structure needs to be selected to provide a good stress relief as well as reasonable thermal conductivity. The range of relative density of the foam should be in the range of 7% to 25% of the bulk material (i.e. original material such as copper) to maintain reasonable conductivity. Similarly, the relief structure 600 can be attached to a chip 620 by soldering with layers 610 such as Ni or Au.

Figure 7A:
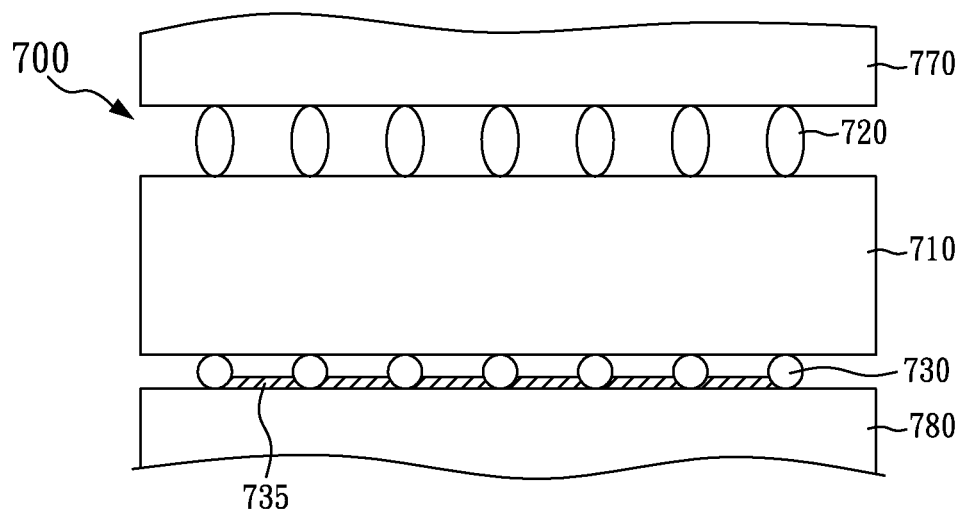
FIG. 7A is a block diagram illustrating a sectional view of another alternative stress relief module in accordance with one or more embodiments.

FIG. 7A illustrates a sectional view of another alternative stress relief structure. This stress relief structure 700 adds solder balls 720 and 730 on both upper and lower sides of a semiconductor chip 710 for heat and/or electrical conduction. The solder balls 720 and 730 are made from a regular solder bump process as the electrical connection to the substrate of the package or can be directly mounted on a PC board. The upper side of semiconductor chip 710 is attached to a heat sink 770 through solder balls 720 and the lower side of the semiconductor chip 710 is attached to circuit board 780 through solder balls 730. An underfill 735 is placed on the surface of circuit board 780 and between solder balls 730 to relieve the stress during temperature cycling. The size of solder balls 720 and 730 may be the same size or different size.

Figure 7B:
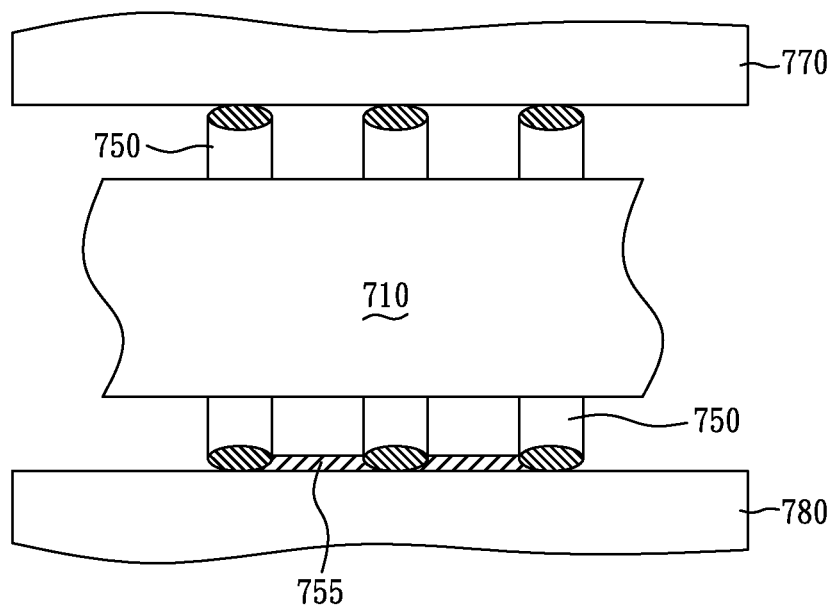
FIG. 7B is a block diagram illustrating a sectional view of a variation of the stress relief module of FIG. 7A in accordance with one or more embodiments.

FIG. 7B illustrates an alternative structure to FIG. 7A by replacing the solder balls 720 and 730 with plated pillars 750. Pillars 750 are short cylindrical metal structures and can be made from gold, copper or nickel which have better conductivity than solder balls. The upper side of semiconductor chip 710 is attached by soldering to a heat sink 770 through the upper side pillars 750 and the lower side of the semiconductor chip 710 is attached to a circuit board 780 by soldering through the lower side pillars 750. Underfill 755 of material such as epoxy is placed on the surface of circuit board 780 which has larger expansion coefficient than chip and between the lower side pillars 750 to relieve the stress during temperature cycling and secure the lower side pillars 750. Normally, the manufacture process starts with the lower side bumping for heat removal in wafer form, then proceed with underfill process and finally the wafer can be processed for upper side wafer bumping.

The present disclosure has been presented for purposes of illustration and description only. They are not intended to be exhaustive or to limit the present invention to the form disclosed. Accordingly, many modifications and variations will be apparent to practitioners skilled in the art. Additionally, the above disclosure is not intended to limit the present disclosure.

What is claimed is:

1. An apparatus for relieving thermal stress, comprising:
 a metal substrate having a plurality of trench groups along a first horizontal direction and a plurality of trench groups along a second horizontal direction, said first and second horizontal directions are substantially perpendicular to each other;
 wherein each trench group comprises at least one trench opened from a top surface and at least one trench opened from a bottom surface of said metal substrate, and the depth of said at least one trench opened from said top surface and the depth of said at least one trench opened from said bottom surface are each more than half of the thickness of said metal substrate;
 wherein a distance between any two trench groups on each horizontal direction is at least three times a trench group width.

2. The apparatus of claim 1, wherein each trench has a predetermined depth and width based on the thickness of said metal substrate.

3. The apparatus of claim 1, wherein at least one trench of a given trench group is extended only partially across a width of said metal substrate in either said first horizontal direction or said second horizontal direction.

4. The apparatus of claim 1, wherein said metal substrate is partitioned by said trench groups into a number of smaller metal substrates, and the number of said smaller metal substrates is an integer number larger than one.

* * * * *